//-->
United States Patent [19]

Gofuku et al.

[11] Patent Number: 4,886,962
[45] Date of Patent: Dec. 12, 1989

[54] METHOD FOR DRIVING A PHOTO-SENSOR BY APPLYING A PULSE VOLTAGE TO AN AUXILIARY ELECTRODE DURING A NON-READ TIME

[75] Inventors: Ihachiro Gofuku, Hiratsuka; Yoshiyuki Osada, Atsugi; Katsumi Nakagawa, Kawasaki, all of Japan

[73] Assignee: Canon Kabushiki Kaisha, Tokyo, Japan

[21] Appl. No.: 244,562

[22] Filed: Sep. 12, 1988

Related U.S. Application Data

[63] Continuation of Ser. No. 63,062, Jun. 17, 1987, abandoned.

[30] Foreign Application Priority Data

Jun. 20, 1986 [JP] Japan ................................ 61-142986

[51] Int. Cl.[4] .............................................. H01J 40/14
[52] U.S. Cl. .................................. 250/211 J; 357/30
[58] Field of Search ............... 250/211 R, 211 J, 578; 357/2, 28, 30 H, 24 LR; 358/213.31, 213.26

[56] References Cited

U.S. PATENT DOCUMENTS

| | | | |
|---|---|---|---|
| 4,040,076 | 8/1987 | Kosonocky et al. | 250/211 J |
| 4,096,512 | 6/1978 | Polinsky | 250/211 J |
| 4,141,024 | 2/1979 | Kano et al. | 357/24 |
| 4,213,137 | 7/1980 | Pines | 357/30 |
| 4,366,503 | 12/1982 | Terakawa et al. | 358/213.31 |
| 4,532,549 | 7/1985 | Ozaki et al. | 358/213.31 |
| 4,638,361 | 1/1987 | Takeshita | 358/213.31 |
| 4,663,535 | 5/1987 | Nakai et al. | 357/30 |
| 4,672,221 | 6/1987 | Saito et al. | 250/578 |
| 4,719,348 | 1/1988 | Saito et al. | 250/211 R |

*Primary Examiner*—David C. Nelms
*Assistant Examiner*—William L. Oen
*Attorney, Agent, or Firm*—Fitzpatrick, Cella, Harper & Scinto

[57] ABSTRACT

A method for driving a photo-sensor to produce an improved, stable output which exactly represents the incident light is disclosed. The photo-sensor has a pair of main electrodes found on a semiconductor layer with a photo-sensing area arranged therebetween. A semiconductor layer and an auxiliary electrode are formed on at least the photo-sensing area with an insulating area being interleaved therein. The auxiliary electrode is used for stabilizing the photosensing output and providing a signal proportional to the incident light. The method of driving such a photo-sensor includes applying a bias voltage to the auxiliary electrode in accordance with the carriers carrying a current of the semiconductor layer. A voltage of the same polarity as that of the bias voltage, but smaller in absolute value, is applied to the auxiliary electrode for a predetermine period of time in a non-read period of the photo-sensor to cause a next photo-sensor output to be read while a previous photo-sensor has been erased.

2 Claims, 4 Drawing Sheets

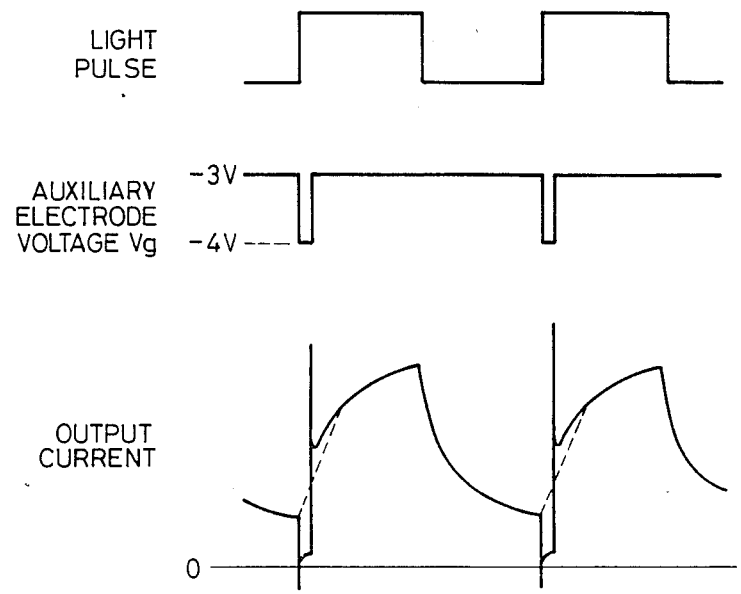
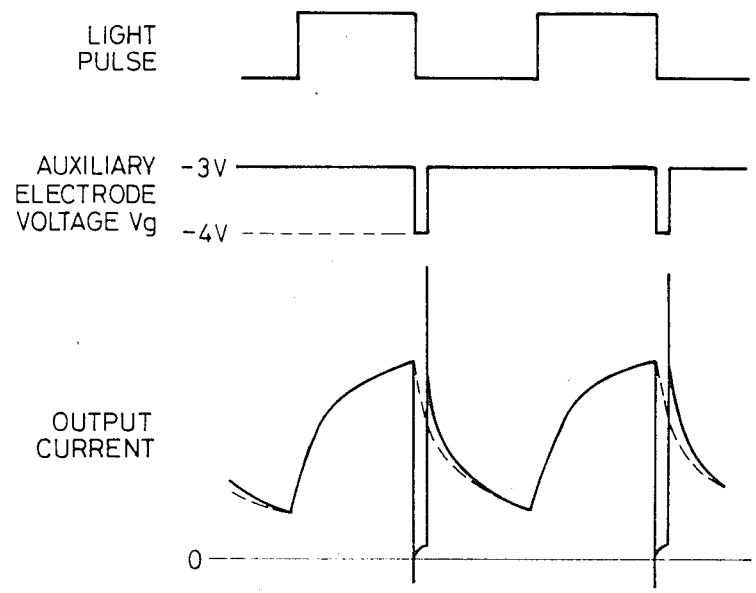

METHOD FOR DRIVING A PHOTO-SENSOR BY APPLYING A PULSE VOLTAGE TO AN AUXILIARY ELECTRODE DURING A NON-READ TIME

This application is a continuation of application Ser. No. 063,062 filed June 17, 1987, now abandoned.

BACKGROUND OF THE INVENTION

1. Field of the Invention

The present invention relates to a method for driving a photo-sensor for improving a response to light. The present method for driving the photo-sensor is applicable to a photo-sensor in an image input unit such as facsimile machine, digital copier or scanner, or a photo-sensor for reading image information at an equi-magnification.

2. Related Background Art

As electronic office equipment such as facsimile machines or digital copiers have become polular, demand for a compact and low cost image input device has increased. Thus, an equi-magnification line sensor which can be directly contacted to a document sheet and does not require a focusing system, or one that allows a short operation distance for the focusing system has become an object of public attention.

The equi-magnification line sensor has the same length as one side of the document sheet and comprises a number of photo-sensors arranged with a high density to attain a high resolution. However, in order to rapidly read information from such a number of photo-sensors, it is important to improve a photo-response time of the photo-sensor.

A photo-sensor having an auxiliary electrode formed on a photo-conductive layer with an insulative layer being interleaved therebetween has been proposed (for example, in Japanese Laid-Open Patent Application No. 239072/1985). By the provision of the auxiliary electrode, an output of the photo-sensor is stabilized and an output proportional to a light intensity is produced.

FIGS. 1 and 2 show structures of photo-sensors having auxiliary electrodes.

In FIG. 1, an auxiliary electrode 2 and an insulative layer 3 are formed on an insulator substrate 1 such as glass or a ceramic, and a semiconductor layer 4 such as CdS.Se or a-Si:H is formed thereon as a photo-conductive layer. A pair of main electrodes 6 and 7 are formed on ohmic contact doping semiconductor layers 5, and a photo-sensing window 8 is formed therebetween.

In the photo-sensor shown in FIG. 2, the elements having the functions similar to those of the photo-sensor of FIG. 1 are designated by like numerals. The substrate 1 is transparent so that light is received through the substrate 1.

FIGS. 3A and 3B show waveforms for explaining a prior art method for driving the photo-sensor.

A high level drive voltage with respect to a potential of the main electrode 6 is applied to the main electrode 7, and a low level voltage $V_g = -3V$ is applied to the auxiliary electrode 2. Under this condition, the number of electrons in the semiconductor layer 4 is small and an output current flowing across the main electrodes is small unless light is detected.

In FIG. 3A, when a light of 100 Luxes is detected, a pulse voltage is applied to the auxiliary electrode 2 and reading is started.

As the pulse voltage rises, the voltage $V_g$ of the auxiliary electrode 2 reaches $-4V$. Since positive charges corresponding to the capacity of the auxiliary electrode 2 are short, the electrons in the semiconductor layer 4 are swept out of the main electrode 7. As a result, an electron density reduces and the output current rapidly reduces. As the voltage $V_g$ of the auxiliary electrode 2 returns to $-3V$ by the fall of the pulse voltage, the positive charges are in excess and the excess electrons are injected from the main electrode 6 into the semiconductor layer 4 so that the output current rapidly increases, (the change of the output current is shown by a solid line.) As the light pulse falls, the output current gradually decreases. By storing charges in the capacitor with the output current in the read period in a capacitor, the stored charges represent light information of the incident light pulse.

When the voltage $V_g$ of the auxiliary electrode 2 is fixed to $-3V$ instead of applying the pulse voltage, the output current increases as the light pulse rises as shown by a broken line, and it gradually decreases as the light pulse falls.

In FIG. 3B, when a light of 100 Luxes is extinguished and a dark state is created, a pulse voltage is applied to the auxiliary electrode 2 to start reading. A change of output current is shown by a solid line. When the voltage $V_g$ of the auxiliary electrode 2 reaches $-4V$, the output current rapidly decreases, and when the voltage $V_g$ returns to $-3V$, it rapidly increases. Again, the charges stored in the capacitor by the output current in the read period represents the light information of the light pulse.

When the pulse voltage is not applied but the voltage $V_g$ of the auxiliary electrode 2 is fixed to $-3V$, the output current changes in accordance with the rise and fall of the light pulse, as shown by a broken line in FIG. 3B.

In the above drive method, it appears that the rise of the output current is improved by the application of the pulse voltage to the auxiliary electrode 2 as shown in FIG. 3A, but it is not a substantial improvement when the light information is read in accordance with the stored charges.

As shown in FIG. 3B, the previous output current remains even after the application of the pulse voltage, and the output which exactly represents the incident light is not produced.

SUMMARY OF THE INVENTION

It is an object of the present invention to provide a method for driving a photo-sensor which solves the problems encountered in the prior art method.

It is another object of the present invention to provide a method for driving a photo-sensor which can produce a signal which exactly represents incident light and which is stable.

In accordance with the present invention, there is provided a method for driving a photo-sensor having a pair of main electrodes formed on a semiconductor layer with a photo-sensing area being arranged therebetween, and having the semiconductor layer and an auxiliary electrode laminated on at least the photo-sensing area through an insulative layer, characterized in that a bias voltage is applied to the auxiliary electrode in accordance with carriers which carry a current of the semiconductor layer, and a voltage of the same polarity as that of the bias voltage and smaller in absolute value than the bias voltage is applied for a predetermined time in a non-read period of the photo-sensor.

BRIEF DESCRIPTION OF THE DRAWINGS

FIGS. 3A and 3B show waveforms for explaining a known drive method for a photo-sensor.

DETAILED DESCRIPTION OF THE PREFERRED EMBODIMENTS

Figure 1:
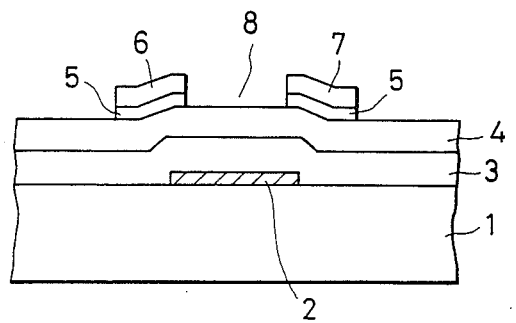
FIGS. 1 and 2 show structures of photo-sensors having auxiliary electrodes.
Figure 2:
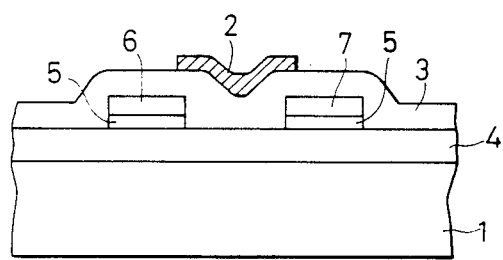
Figure 4A:
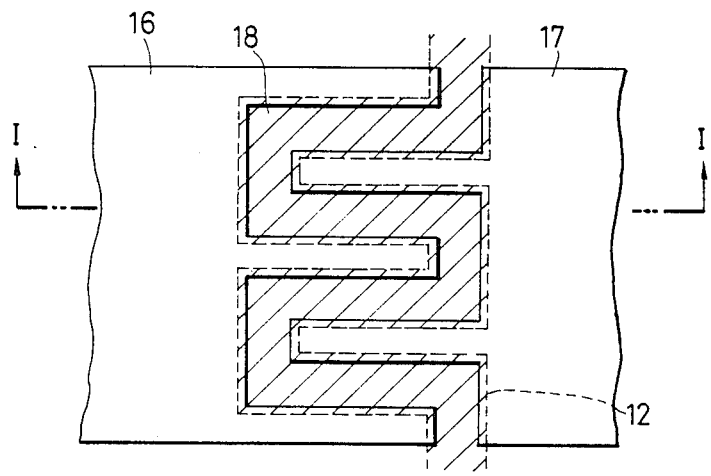
FIG. 4A shows a plan view of one bit of a photo-sensor arranged in a line.
Figure 4B:
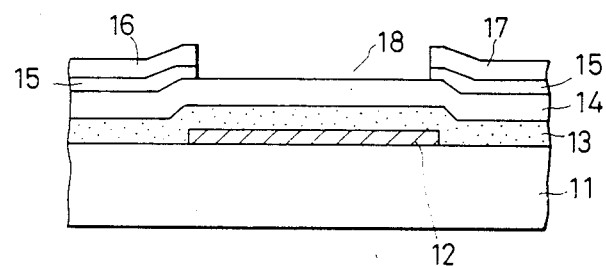
FIG. 4B shows an I—I sectional view of the FIG. 4A device.

FIG. 4A shows a plan view of one bit of photo-sensor arranged in a line, and FIG. 4B shows an I—I sectional view thereof.

The photo-sensor shown in FIGS. 4A and 4B comprises an auxiliary electrode 12 made of metal such as Cr formed on a substrate 11 such as glass, an insulative layer 13, a semiconductor layer 14, an ohmic contact layer 15 and main electrodes 16 and 17.

A process for manufacturing the photo-sensor shown in FIGS. 4A and 4B will be explained below.

On a glass plate which serves as the substrate 11, Cr is deposited to a thickness of 500 Å and Al is deposited to a thickness of 500 521 , and they are patterned into a desired shape by photo-lithography to form the auxiliary electrode 12. An SiN:H layer having a thickness of 3000 Å which serves as the insulative layer 13, a non-doped hydro-amorphous silicon (a-Si:H) layer having a thickness of 4000 Å which serves as the semiconductor layer 14, and an n+ layer having a thickness of 1200 Å which serves as the ohmic contacts 15 are continuously formed by a glow discharge electrolysis method.

The SiN:H layer may be formed by using 5 SCCM of 10% hydrogen diluted $SiH_4$ and 14.4 SCCM of $NH_3$ at a substrate temperature of 200° C., an internal pressure of 0.15 Torr, an RF power of 3.5 watts and a discharge time of 2 hours and 40 minutes.

The non-doped a-Si:H layer may be formed by using 20 SCCM of 10% hydrogen diluted $SiH_4$ at a substrate temperature of 200° C., an internal pressure of 0.12 Torr, an RF power of 5.5 watts and a discharge time of 2 hours.

The n− layer 15 may be formed by using 5 SCCM of 10% hydrogen diluted $SiH_4$ and 50 SCCM of 100 ppm $PH_3$ at a substrate temperature of 200° C., an internal pressure of 0.12 Torr, an RF power of 17.5 watts and a discharge time of 45 minutes.

Then, the auxiliary electrode 12 is taken out and any unnecessary semiconductor layer between adjacent bits is removed by photolithography. A Cr layer of 500 Å thick and an Al layer of 5000 Å thick are deposited thereon, the main electrodes 16 and 17 are formed by photo-lithography with partial overlap with the auxiliary electrode 12, and the unnecessary area of the n− layer 15 is removed by using the main electrodes as masks to form the photo-receiving window 18.

Since the width of the auxiliary electrode 12 is larger than the width of the photo-receiving window 18, the output control by the auxiliary electrode 12 is stabilized.

However, in order to prevent unnecessary electrode capacitance, the overlapping between the auxiliary electrode 12 and the main electrodes 16 and 17 should be as small as possible.

The present method of driving the photo-sensor will now be explained.

Figure 5:
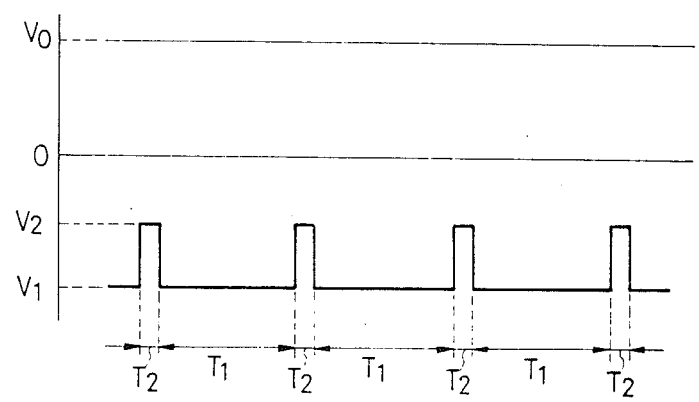
FIG. 5 shows voltage waveforms for explaining one embodiment of a method for driving a photo-sensor in accordance with the present invention.

FIG. 5 shows a waveform for explaining one embodiment of the method for driving the photo-sensor. In the present embodiment, the semiconductor layer 14 is of the n type.

A voltage $V_o$ is applied to the main electrode 17 with reference to the main electrode 16, where $V_o > 0$.

A voltage $V_1$ is a bias voltage applied to the auxiliary electrode 12 in the sensor read time $T_1$.

Since the semiconductor layer 14 is of the n type, $V_1 < 0$.

A voltage $V_2$ is a voltage applied to the auxiliary electrode 12 in the non-read time $T_2$, where $V_1 < V_2 < 0$.

By changing the voltage of the auxiliary electrode 12 from the bias voltage in the positive direction in the non-read time $T_2$, the fall time of the output current is significantly improved.

A drive circuit for applying the bias voltage and pulse voltage shown in FIG. 5 to the auxiliary electrode 12 may be readily constructed and hence it is not shown.

Figure 6A:
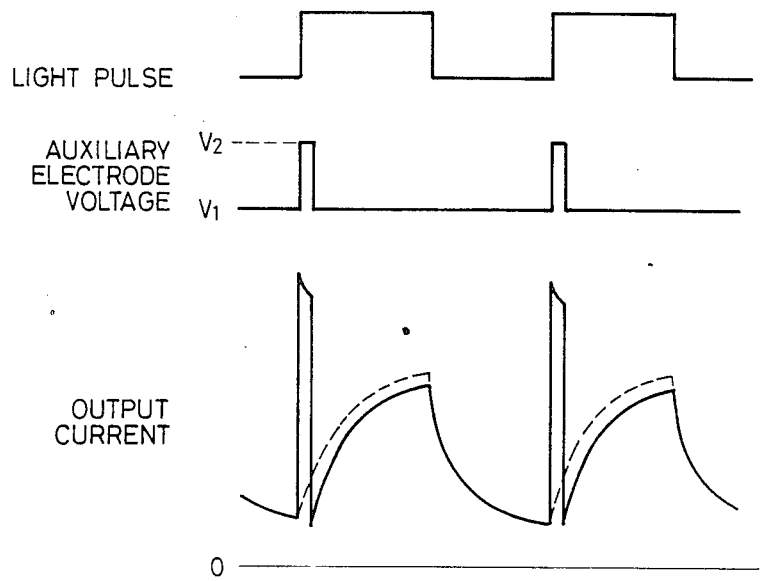
FIGS. 6A and 6B show wave forms for explaining a change in an output current in the present embodiment.
Figure 6B:
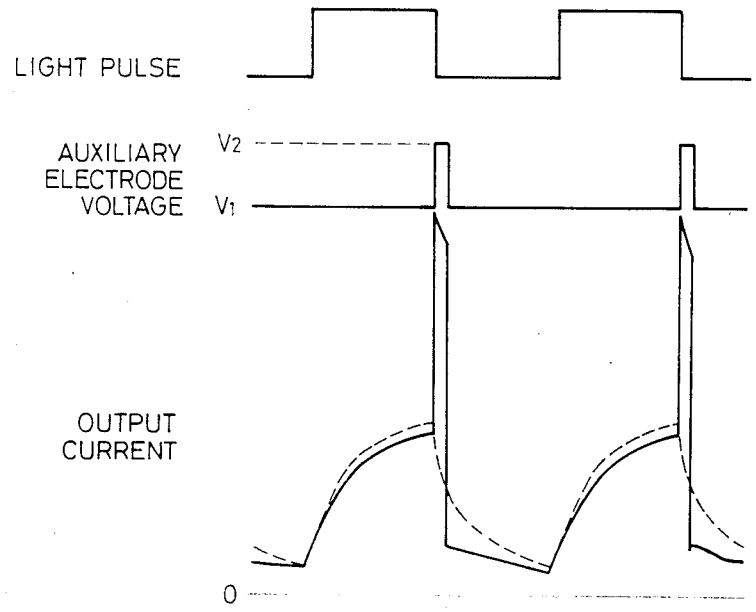

FIGS. 6A and 6B show waveforms for explaining the change of the output current in the present embodiment.

In FIG. 6A, a light pulse is applied immediately before the start of reading, and in FIG. 6B, the light is applied until immediately before the start of reading.

In FIG. 6A, assuming that the bias voltage $V_1$ is −3V, the pulse voltage $V_2$ is −2.8V, and the reading is started upon application of the pulse voltage $V_2$ to the auxiliary electrode 12, the potential of the auxiliary electrode 12 changes in the positive direction and electrons are injected from the main electrodes 16 so that a large output current flows. Recombination of holes in the semiconductor layer 14 is accelerated by the injected electrons. As a result, the number of holes is small and even if a light is applied, the rise of the output current slightly delays compared to a case where the potential of the auxiliary electrode 12 is fixed (shown by the broken line). However, the waveform of the output current conforms to the light pulse and the charges stored by the output current represents the light information corresponding to the incident light.

On the other hand, as shown in FIG. 6B, even when the light is applied until immediately before the start of reading, the output pulse corresponds to the light pulse. When the pulse voltage $V_2$ is applied to the auxiliary electrode 12, the recombination of holes by the injected electrons is accelerated, and when the potential of the auxiliary electrode 12 returns to the bias voltage $V_1$, the dark state current is maintained because unnecessary holes do not exist and it rises upon the application of the light pulse.

By applying the pulse voltage $V_2$ to the auxiliary electrode 12 immediately before reading, the output of the previous reading is reset. Accordingly, the next output is not affected by the previous output unlike the case where the potential of the auxiliary electrode 12 is fixed to the bias voltage $V_1$ (change shown by a broken line in FIG. 6B) or in the prior art method.

Accordingly, the next output is read while the output in the previous read time $T_1$ has been erased, and an output which exactly represents the input light can be produced. As a result, the light response time is improved and the read operation is speeded up.

The present drive method can produce an output current which exactly represents the incident light, and it is not limited to the system in which the output of the photo-sensor is stored in a capacitor to produce the light information.

In the present embodiment, the carriers which carry the current of the semiconductor layer in the photo-sensor are electrons. The present invention is also applicable to the system which uses a p-type or i-type semiconductor and in which the carriers which carry the current are holes, by reversing the polarities of the voltage. When the carriers are electrons, $V_1 < V_2 < 0$ as shown in the above embodiment, and when the carriers are holes, $V_1 > V_2 > 0$.

When the semiconductor layer is of i-type, the carriers which carry the current are determined by the conductivity type of the ohmic contact layer 15.

In accordance with the drive method for the photo-sensor in the present embodiment, a voltage of the same polarity as that of the bias voltage and smaller in absolute value than the bias voltage is applied to the auxiliary electrode in the non-read time so that the next output is read while the previous output has been erased. Thus, the light response time is improved and a stable output which exactly represents the incident light is produced. Thus, the light response is significantly improved over the prior art method.

When a line sensor having a number of pixel sensors is used, the document can be read at a high speed and the image information is read at equi-magnification.

We claim:

1. A method for driving a photo-sensor having a pair of main electrodes formed on a semiconductor layer with a photo-sensing area being arranged therebetween, and the semiconductor layer and an auxiliary electrode formed on at least the photo-sensing area with an insulative layer being interleaved, the auxiliary electrode being used for stabilizing the photo-sensor output, comprising the steps of:

applying a bias voltage to the auxiliary electrode in accordance with carries carrying a current of the semiconductor layer; and applying a voltage of the same polarity as that of the bias voltage and smaller in absolute value than the bias voltage to the auxiliary electrode for a predetermined time in a non-read period of the photosensor to cause a next photo-sensor output to be read while a previous photo-sensor output has been erased.

2. A method for driving a photo-sensor according to claim 1 wherein the voltage of the same polarity as that of the bias voltage and smaller in absolute value than the bias voltage is applied to the auxiliary electrode for the predetermined time immediately before reading of the photo-sensor.

* * * * *

UNITED STATES PATENT AND TRADEMARK OFFICE
CERTIFICATE OF CORRECTION

PATENT NO. : 4,886,962
DATED : December 12, 1989
INVENTOR(S) : Ihachiro Gofuku, et al.

It is certified that error appears in the above-identified patent and that said Letters Patent is hereby corrected as shown below:

Title page:

[56]  References Cited:

Line 1, "4,040,076 8/1987 Kosonocky et al." should read -- 4,040,076 8/1977 Kosonocky et al.--.

[57]  ABSTRACT:

Line 4, "found" should read --formed--.

COLUMN 3:

Line 33, "500 521," should read --500 Å,--.

Line 52, "n⁻layer 15" should read --$n^+$ layer 15--.

Line 63, "n⁻" should read --$n^+$--.

COLUMN 6:

Line 14, "carries" should read --carriers--.

Signed and Sealed this

Fifth Day of March, 1991

Attest:

HARRY F. MANBECK, JR.

*Attesting Officer*      *Commissioner of Patents and Trademarks*